United States Patent [19]

Paoli

[11] Patent Number: 5,023,882
[45] Date of Patent: Jun. 11, 1991

[54] PHASED LOCKED ARRAYS WITH SINGLE LOBE OUTPUT BEAM

[75] Inventor: Thomas L. Paoli, Los Altos, Calif.

[73] Assignee: Xerox Corporation, Rochester, N.Y.

[21] Appl. No.: 519,718

[22] Filed: May 7, 1990

[51] Int. Cl.[5] ................................................ H01S 3/19
[52] U.S. Cl. ......................................... 372/50; 372/24; 372/46
[58] Field of Search ..................... 372/50, 45, 46, 24

[56] References Cited

U.S. PATENT DOCUMENTS

| | | | |
|---|---|---|---|
| 4,217,561 | 8/1980 | Scifres et al. | 331/94.5 H |
| 4,219,785 | 8/1980 | Scifres et al. | 331/94.5 H |
| 4,470,143 | 9/1984 | Kitamura et al. | 372/50 |
| 4,578,791 | 3/1986 | Chen | 372/50 |
| 4,641,311 | 2/1987 | Ackley | 372/18 |
| 4,718,069 | 1/1988 | Streifer et al. | 372/50 |
| 4,719,632 | 1/1988 | Lindsey et al. | 372/50 |
| 4,719,634 | 1/1988 | Streifer et al. | 372/46 |
| 4,722,089 | 1/1988 | Botez et al. | 372/50 |
| 4,751,711 | 6/1988 | Welch et al. | 372/50 |
| 4,802,182 | 1/1989 | Thornton et al. | 372/50 |
| 4,852,113 | 7/1989 | Botez | 372/50 |
| 4,939,737 | 7/1990 | Matsui et al. | 372/50 |

OTHER PUBLICATIONS

"Impurity-Induced Disordered Phase Modulators in AIGaAs/GaAs Quantum-Well and Double-Heterostructure Waveguides", T. Hausken, et al., *Applied Physics Letters*, 53 (9) 8/29/88.

"Propogation, Modulation and Oscillation in Optical Dielectric Waveguides," pp. 354–402.

"Dependence of Central-Lobe Output Power on Fill Factor of an In-Phase Laser Array," J. E. Epler, et al., *Electronics Letters*, 7/2/87, vol. 23, No. 14.

"Reduction of Turn-On Delay in Laser Diode Optical Switch," M. Ikeda, *Electronics Letters*, 19, 53–54 (1983).

"Tandem Switching Characteristics for Laser Diode Optical Switches," M. Ikeda, *Electronics Letters*, 3/14/85, vol. 21, No. 6, pp. 252–254.

"Laser Diode Switches," M. Ikeda, *Electronics Letters*, 17, 899 (1981).

"Laser Diode Optical Switch Module," Kataka, *Electronics Letters*, 20, 438 (1984).

"High-Power AIGaAs Buried Heterostructure Lasers with Flare Flared Waveguides," D. F. Welch, et al., *Appl. Phys. Lett.*, 50 (5), 2/2/87.

"High-Power (cw) In-Phase Locked Y Coupled Laser Arrays," D. F. Welch, et al., *Appl. Phys. Lett.* 49 (24) 12/15/86.

*Primary Examiner*—James W. Davie
*Attorney, Agent, or Firm*—Townsend and Townsend

[57] ABSTRACT

A semiconductor laser array includes a set of low-loss waveguides for transmitting generated light waves to an external facet. The width of the output waveguides is less than a critical width required for complete confinement of the transmitted light so that the spot width of the light transmitted by each waveguide is increased to greater than 75% of the spacing between the output waveguides to produce a single-lobed beam. In one embodiment, scanning contacts induce a bias on a set of low-loss output waveguides to scan an output beam.

42 Claims, 4 Drawing Sheets

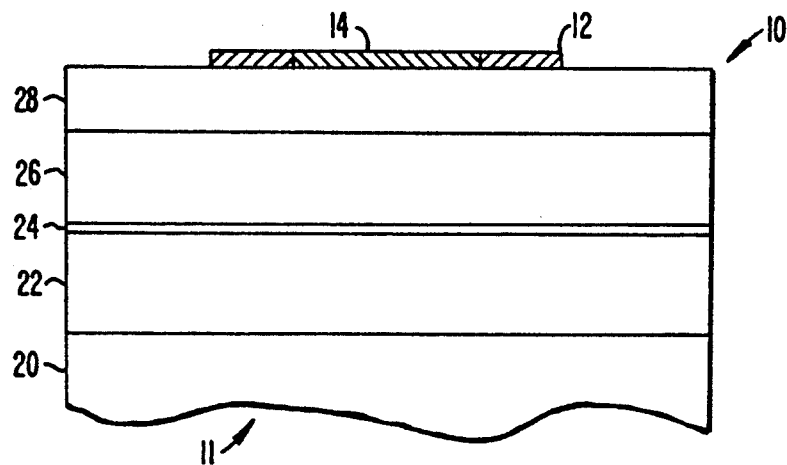
FIG._1.
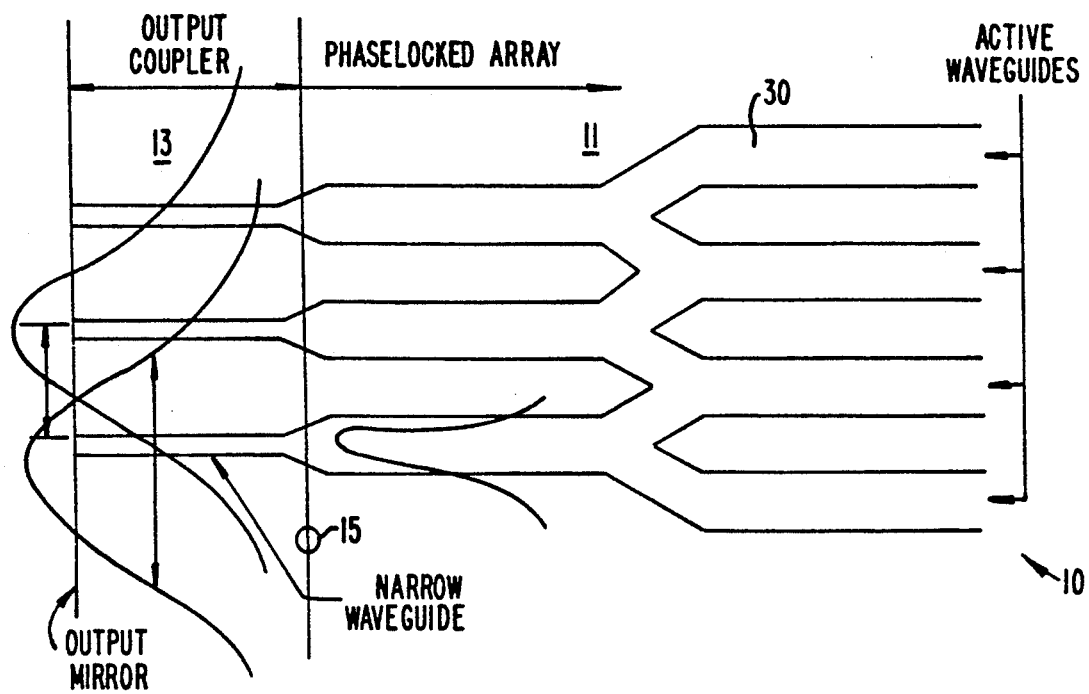
FIG._2A.

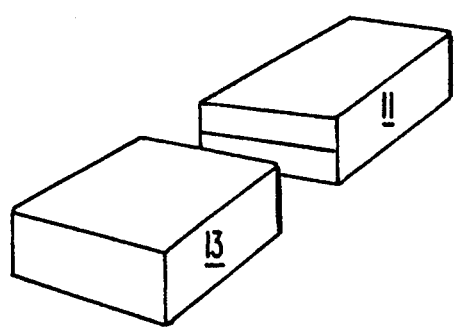
FIG._2B.
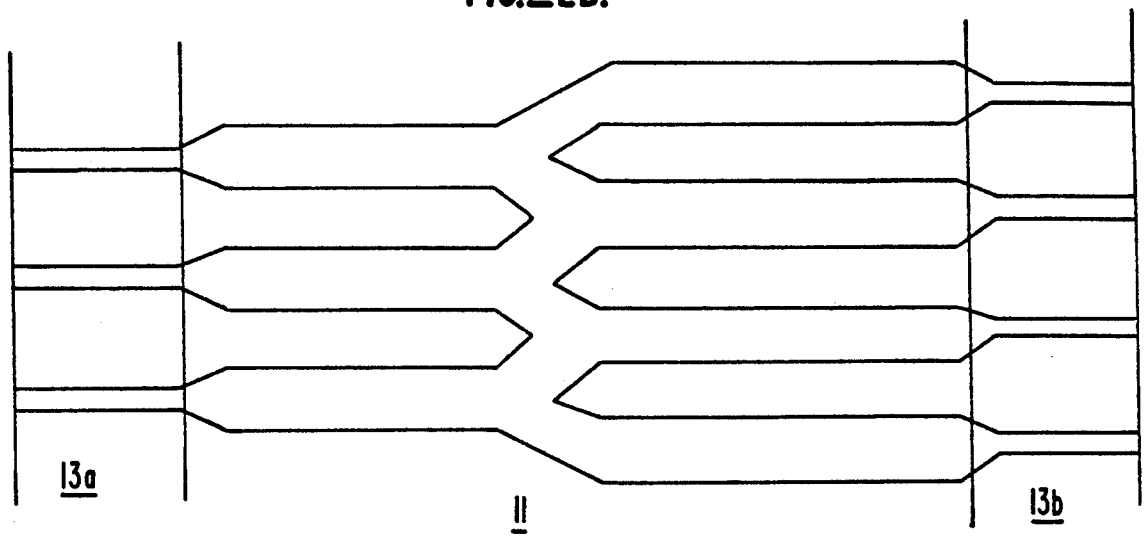
FIG._2C.
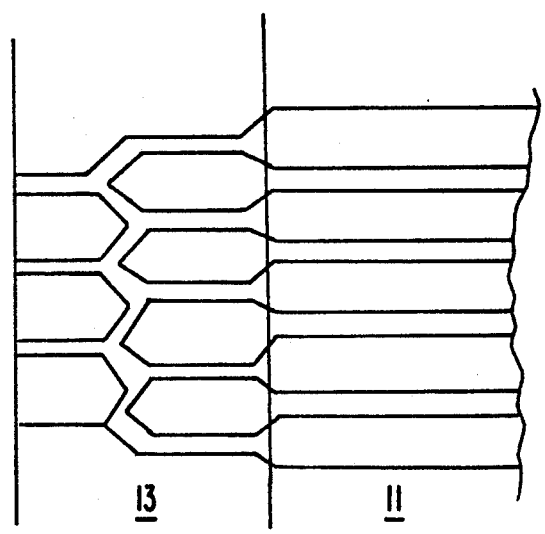
FIG._2D.

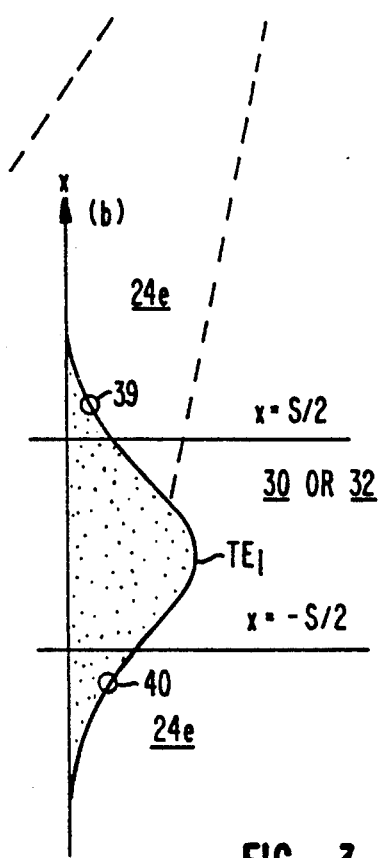
FIG._3.
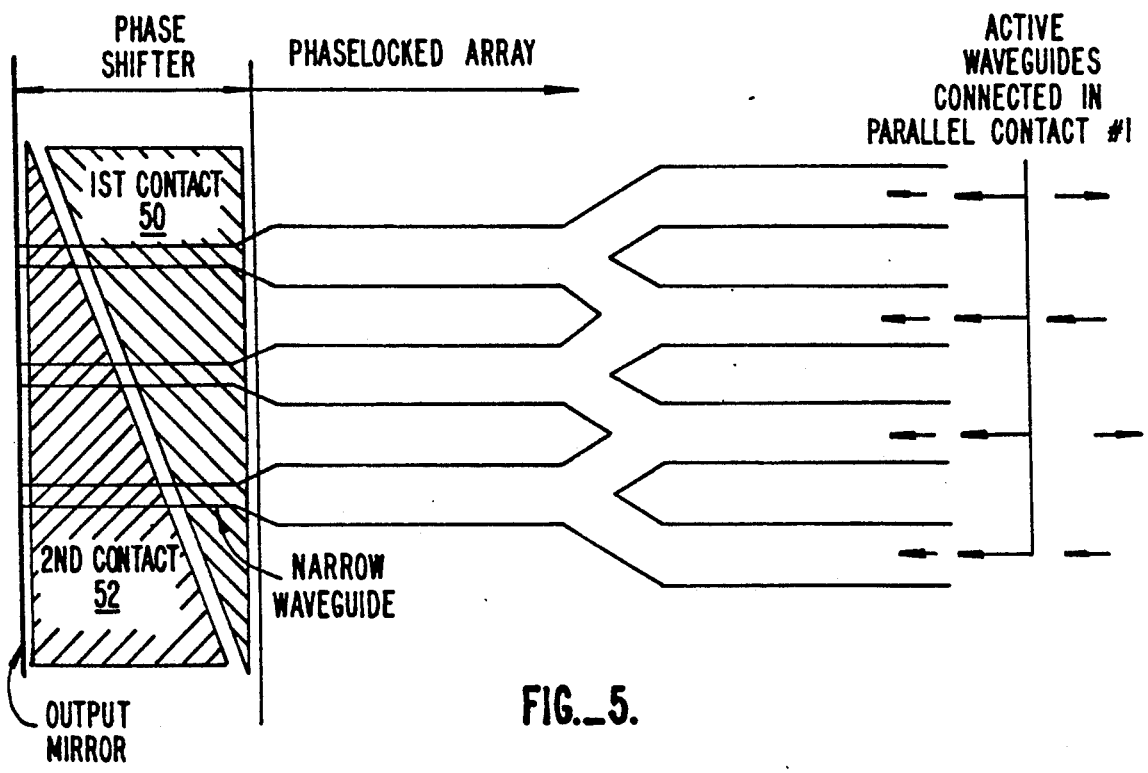
FIG._5.

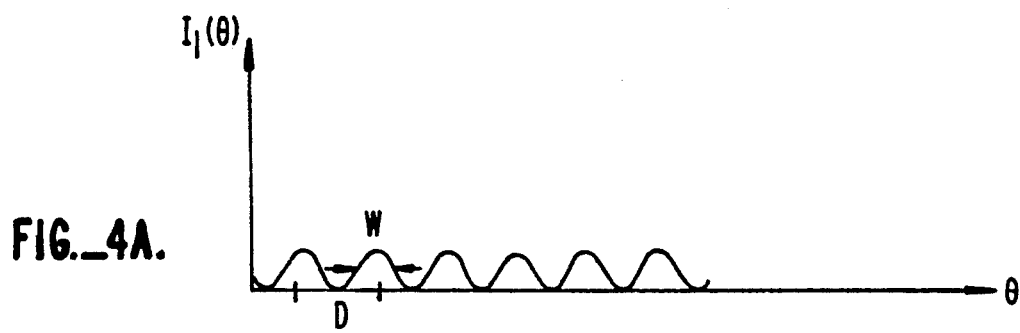
FIG._4A.
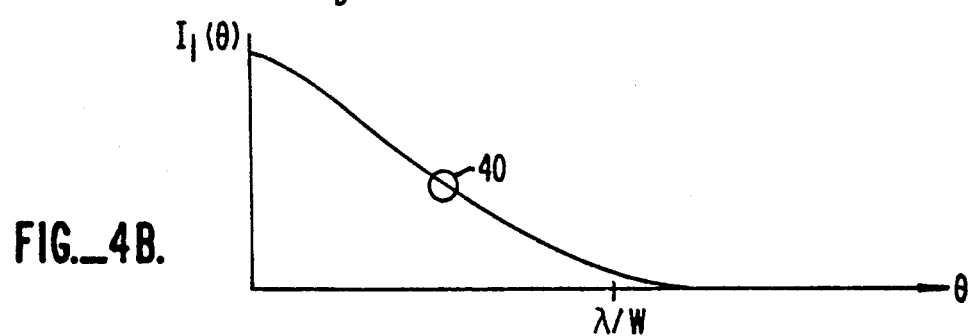
FIG._4B.
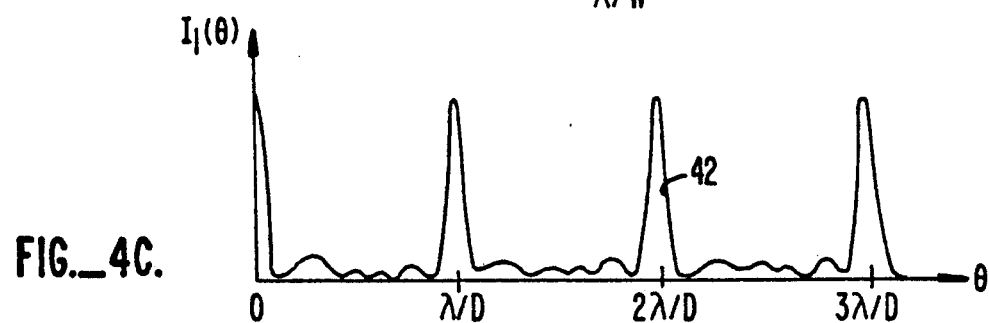
FIG._4C.
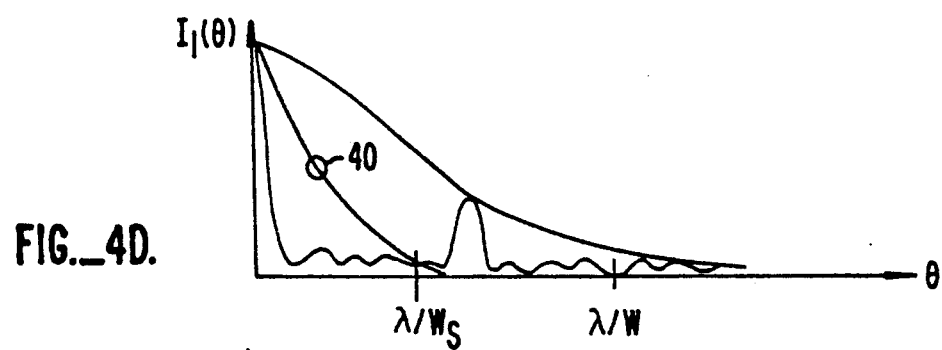
FIG._4D.
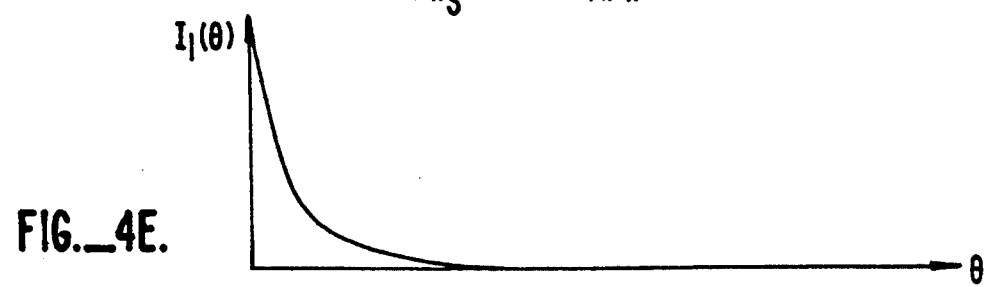
FIG._4E.

PHASED LOCKED ARRAYS WITH SINGLE LOBE OUTPUT BEAM

BACKGROUND OF THE INVENTION

1. Field of the Invention

The invention relates to a phased-array semiconductor laser and more particularly to an output structure for the laser.

2. Description of the Relevant Art

Phased-array lasers include a set of directly coupled waveguide amplifiers which generate in-phase light waves. Each waveguide has a terminal aperture at a laser facet that radiates the light waves generated in the waveguide amplifier. Typically, a radiated output beam from the phased-array laser includes a high-intensity central lobe and several low intensity sidelobes. These sidelobes increase the width of the beam and divert energy from the central beam.

Many laser applications require a highly resolved output beam. Accordingly, much effort has been expended to develop a phased-array laser that produces an output beam having only a single lobe. It is well-known that for an array of radiators having aperture size S and spacing distance D the ratio of S to D must be greater than 75% to obtain a single-lobed output beam.

In existing systems, the output waveguides are forward biased to amplify the light waves propagating therethrough. Thus, if the distance, D, between waveguides is reduced to obtain a single-lobed output beam then evanescent coupling between the output waveguides will occur. Conversely, if the output waveguides are flared to increase the size of the output apertures then higher order transverse modes may be supported. Either evanescent coupling or higher order modes may destabilize the laser output beam.

In U.S. Pat. No. 4,718,069 Streifer et al. teach variable spacing of the output waveguides to achieve a single-lobed output beam. Y-shaped couplers are used to assure coupling between widely spaced output waveguides and the output waveguides are forward-biased to achieve light amplification.

Additionally, many systems, such as a facet scanning system or optical fiber array input scanning, require an output beam which may be scanned in a controllable manner. Typically, an output structure utilizing scanning electrodes is used to vary the index of refraction according to some function across the array. Generally, the bias induced by the scanning electrode is impressed on an amplifying portion of the laser and interferes with the bias applied to cause amplification. Such interference can affect the stability of the laser output beam.

SUMMARY OF THE INVENTION

According to one aspect of the present invention, an output structure includes a set of output waveguides which are transparent to the light generated by the laser. The output structure does not amplify the light waves generated in the laser and thus does not affect the output stability of the laser.

According to a further aspect of the invention, the width of the output waveguides is less than the critical width required to completely confine the guided light waves within the waveguide so that the spot size of light radiated from the output waveguides is increased to greater than about 75% of the spacing between the waveguides to produce a single-lobed output beam.

The problems of evanescent coupling and support of extra modes are obviated because there is no gain in the transparent output waveguides which support only one mode.

According to another aspect of the invention, a scanning contact electrode pair is used to bias an array of transparent output waveguides to scan a laser output beam. The output stability of the laser is not adversely affected because the scanning bias is not applied to gain regions of the laser.

Additional advantages and features of the invention will be apparent in view of the appended drawings and following detailed description.

BRIEF DESCRIPTION OF THE DRAWINGS

FIG. 1 is a cross-sectional view of a typical layer structure in a semiconductor laser;

FIG. 2A is a top view of a semiconductor laser array incorporating a preferred embodiment of the output structure of the present invention;

FIG. 2B is a perspective view of a hybrid structure including a separate laser and coupler;

FIG. 2C is top view of a laser array having two output structures;

FIG. 2D is a top view of a laser array having a y-coupled passive output structure;

FIG. 3 is a graph of the light wave intensity for an index-guided waveguide;

FIGS. 4A-4E are graphs depicting output beam intensities; and

FIG. 5 is a top view of a semiconductor laser array incorporating a preferred embodiment of the scanning system of the present invention.

DETAILED DESCRIPTION OF THE PREFERRED EMBODIMENTS

The primary focus of the invention is the provision of an improved output structure for forming a single-lobed output beam that avoids the problems of the prior art.

Referring now to FIGS. 1 and 2A, there is illustrated an enlarged view of a semiconductor structure 10 comprising a plurality of epitaxially deposited layers 22-28 on substrate 20. As an example of a semiconductor structure 10 is a semiconductor heterostructure comprising a central section 11, which may be an active medium, and a passive waveguide section 13 separated by a boundary 15. Structure 10 may include a substrate 20, which may be comprised of n-GaAs, on which are consecutively deposited in an MO-CVD reactor epitaxial layers 22-28, as is known in the art. These epitaxially deposited layers may be, for example, as follows: Cladding layer 22 of n-Ga$_{1-y}$Al$_y$As wherein, for example, y=0.40; active region 24 comprising a layer of GaAs or Ga$_{1-x}$Al$_x$As where y>x, or a single quantum well layer of GaAs or a multiple quantum well of alternating layers of GaAs and Ga$_{1-x}$Al$_x$As or alternating layers of Ga$_{1-x}$Al$_x$As and Ga$_{1-z}$Al$_z$As where y>z>x; cladding layer 26 of p-Ga$_{1-y}$Al$_y$As and a cap layer 28 of p+GaAs. In the particular example here, active region 24 comprises multiple quantum wells. This multiple well structure is comprised of four 12 nm quantum wells of Ga$_{1-x}$Al$_x$As, wherein x=0.05, separated by three 6 nm barriers of Ga$_{1-z}$Al$_z$As, wherein z=0.20. Therefore, the layer structure has a width, L$_z$, of approximately 66 nm.

In FIG. 2A, a set of index-guided stripes 30, disposed in the active layer 24 of the central section 11, are joined in a Y-coupled configuration. The central section is forward-biased so that light of a given wavelength is generated and amplified under lasing conditions. The Y-couplers cause excited out-of-phase modes to radiate from the straight sections and cause the light waves generated in the stripes 30 to be phase locked. Y-guides are used as an example of any configuration that leads to phase locked operation in the fundamental mode.

A set of index-guided output waveguides 32, disposed in the active layer 24 of the output section 13, are oriented co-axially to the stripes 30 and joined thereto at the boundary 15. These output waveguides 32 are narrower than the stripes 30 and are transparent to the light waves generated in the stripes 30. This set of waveguides serves as an output coupler for the phase-locked array.

A method for forming the index-guided stripes 30 and transparent index-guided waveguides 32 is fully disclosed in U.S. Pat. No. 4,802,182 to Thornton et al. and is hereby incorporated by reference. Alternatively, laser patterned desorption (LPD) waveguides may be utilized. This process is disclosed in U.S. Pat. No. (corresponding to Ser. No. 07/328,988 and Ser. No. 07/257,498) which are thereby incorporated by reference.

The active layer 24 in index-guided stripes and waveguides 30 and 32 has a greater index of refraction than the neighboring areas of active layer 24 and of cladding layers 22 and 26. Thus, the light generated in the stripes and waveguides 30 and 32 is confined by the well-known phenomena of total internal reflection.

FIGS. 2C and 2D depict alternative embodiments. In FIG. 2C output couplers 13a and b are attached to each end of the amplification part 11 of the array. In FIG. 2D the output coupler 13 is a passive y-coupled array that phase-locks the light generated in the amplification section 11.

FIG. 3 is a planar top view schematically depicting the amplitude of the light waves in an index-guided stripe or waveguide 30 or 32 formed in the active region 24. As stated above, the index of refraction of the stripe or waveguide 30 or 32 is greater than the index for the exterior part 24e of the active region 24. The line 39 indicates the strength of the light wave field. In the exterior region 24e the strength of the field decays proportionally to $\exp[-S/2(abs(x))]$ so that the spreading of the light becomes greater when the width of the waveguide becomes smaller.

The characteristics of the output beam emitted from the output waveguides 32 will now be described with reference to FIGS. 4A-4E. The near-field emission pattern is depicted in FIG. 4A where W is the spot width of the light radiated by each output waveguide 32 and D is the spacing between the centers of the output waveguides 32. The far-field single waveguide emission pattern 40 of each waveguide is depicted in FIG. 4A and the point array pattern 2 of an array of point emitters separated by D is depicted in FIG. 4C. The single waveguide pattern 40 has a very small magnitude for values of theta greater than a cut-off point equal to about $\lambda/W$. The actual array pattern for the array depicted in FIG. 4A is the product of the emission patterns of FIGS. 4B and 4C and is depicted in FIG. 4D.

Note that in FIG. 4D the constant heights of the peaks of the point array pattern 42 are modulated by the single waveguide pattern 40. As depicted in FIG. 4D, for a spot width greater than $W_s$ only the first peak will be located before the cut-off point of the single waveguide pattern 40 so that the array pattern 44 will be single-lobed as depicted in FIG. 4E.

As is well-known in the art, a single lobed output beam is obtained when W is equal to about 0.75 D. Typically, waveguides have been designed to obtain nearly complete confinement of the guided light waves so the W, the spot width, is equal to S, the width of the waveguide. Attempts to increase S lead to the problems of extra modes and evanescent coupling described above.

In the present system, the width of the waveguides is decreased below a critical width necessary to obtain complete confinement so that the optical field begins to spread as described above with reference to FIG. 3. Typically, for GaAs lasers this critical width is about 1 micron. Since the output waveguides 32 are narrowed they do not physically interfere as in prior art structures.

Additionally, the output waveguides are transparent so that no biasing is required to reduce absorption. Accordingly, the output structure is not affected by changes in bias voltages or current densities in the active medium 24.

FIG. 5 depicts a system for scanning the farfield angle of the output beam of the laser array. In FIG. 5 a pair of triangular shaped scanning contact pairs 50 and 52 are disposed on the top surface of the second part 13 of the substrate 10. Each contact pair 50 or 52 has a first edge oriented parallel to the boundary 15 and a second edge oriented at 45° to the boundary.

A scanning voltage is applied to the scanning contacts 50 or 52 to reverse-bias the activated length of each output waveguide 30 disposed between the scanning contacts to provide a phase shift in the beam radiated from each output waveguide 30 via the electro-optic effect. The magnitude of the phase shift, P, induced in a given output waveguide 30 is proportional to the length of the output waveguide 30 which is reverse-biased and is equal to:

$$P = 4\pi L n / \lambda$$

where n is the index of refraction and $\lambda 10$ is the wavelength of the generated light waves.

The induced phase shift, P, can be varied by varying the magnitude of the scanning voltage applied to the scanning contacts 50 or 52. In the embodiment depicted in FIG. 5, for the triangular first contact pair 50 the magnitude of the activated length of each output waveguide 30 varies linearly across the array of output waveguides. This linear variation results in a scanning angle $\beta$ defined by the relationship:
$\sin\beta = P\lambda/2\pi D$.

Applying a scanning voltage to the first contact pair 50 increases the phase shift from the bottom to the top of the output waveguide array and therefore scans the beam in a first direction. Biasing the second contact pair 52 increases the phase shift from the top to the bottom of the array and therefore scans the beam in an opposite direction.

The scanning contact pairs 50 and 52 may be forward-biased to obtain a phase-shift due to the variation of the index of refraction caused by the free carrier effect. Further, the shape of the contacts may be changed to vary the magnitude of the activated length across the output waveguide array according to a predetermined function.

The edge of the contact 52 can have other geometric shapes. For example, if the edge were shaped as a parabola the width of the central lobe could be increased.

The bias induced by the scanning electrode pairs 50 or 52 is applied to the second part 13 of the structure where the output waveguides do not function to amplify the light waves generated in the stripes 30. Accordingly, this scanning bias does not interfere with the forward bias used to achieve amplification in the stripes 30 so that the laser output is stable. It is not required to amplify the light waves propagating in the output waveguides 32 because these waveguides 32 are transparent to the light waves generated in the stripes 30.

The invention has now been described with reference to the preferred embodiments and substitutions and modifications will now be apparent to persons of ordinary skill in the art. For example, as depicted in FIG. 2B the coupler 13 and laser 11 may be separate hybrid structures joined at boundary 15. In that case the output waveguides 16 could be formed using lithium niobate. Accordingly, the invention is not intended to be limited except as provided by the appended claims.

What is claimed is:

1. A semiconductor laser array comprising:
a monolithic semiconductor structure, divided into first and second parts separated by a boundary, having a plurality of semiconductor heterostructure layers disposed over a substrate, at least one of said layers being an active layer for light amplification and propagation under lasing conditions;
means, electrically coupled only to said first part, for applying an electrical forward bias to said layers in said first part to generate light waves in said active layer;
a plurality of index-guided amplification waveguides disposed in said first part for propagating only an in-phase array mode and terminating at said boundary;
a plurality of substantially parallel, spaced apart, low-loss, two-dimensional index-guided output waveguides disposed in said second part, each output waveguide oriented co-axially to a corresponding amplification waveguide and co-extensively coupled thereto at said boundary, with each output waveguide of width S and separated from an adjacent output waveguide by a distance D, said output waveguide for guiding said amplified light waves generated in said corresponding coupled amplification waveguide, each output waveguide providing low confinement of a guided light wave, so that the width, W, of the optical field of said generated light guided by said waveguide is substantially greater than S and greater than about 75% of D.

2. The laser array of claim 1 wherein the width S of said output waveguides is less than a critical width required to achieve substantially complete confinement of guided light waves.

3. The laser array of claim 1 wherein the index of refraction differential of said output waveguides is less than a critical value required to achieve substantially total internal reflection.

4. The laser array of claim 1 wherein said plurality of amplification waveguides are in the form of a y-coupled waveguide array.

5. The laser of claim 1 further comprising:
means, electrically coupled to only said second part, for applying a voltage bias to a voltage region part, disposed under said means, of each of said plurality of output waveguides, with the length of the voltage region part varying according to a predetermined contact function across said plurality of output waveguides to deflect said output beam by a predetermined angle.

6. The laser of claim 5 wherein:
said predetermined contact function is a linear function.

7. The laser of claim 5 wherein said means for applying a reverse bias comprises:
an electrode pair, disposed over the surfaces of the second part of said structure, having a first edge oriented parallel to said boundary and having a second edge oriented at an angle of 45° to said boundary.

8. The laser of claim 7 wherein the shape of said second edge is a selected geometric shape.

9. The laser of claim 1 wherein said output waveguides are structures formed in said second part utilizing a layer disordering technique.

10. The laser of claim 1 wherein said output waveguides are structures formed in said second part utilizing an impurity induced layer disordering technique.

11. A hybrid output structure for use with a semiconductor laser array formed in a first monolithic semiconductor structure having a plurality of semiconductor heterostructure layers disposed over a substrate, at least one of said layers being an active layer for light amplification and propagation under lasing conditions, the laser including a plurality of amplification waveguides, disposed in the active layer, having a first end terminating at a boundary and having their centers separated by a distance D, oriented along a first axis in said active layer, with each of said amplification waveguides having a predetermined width, for generating and amplifying phase-locked light waves at a given wavelength in response to said electrical forward bias, with a output coupler comprising:
a plurality of substantially parallel, spaced apart, low-loss, two-dimensional index-guided output waveguides disposed in a second monolithic structure, each output waveguide positioned in the structure to be oriented co-axially to a corresponding amplification waveguide and co-extensively coupled thereto when the boundary of said coupler is adjacent to the boundary of said laser, with each output waveguide of width S and separated from an adjacent output waveguide by said distance D, for guiding said amplified light waves generated in said corresponding phase-locked array, with said output waveguides providing less confinement of guided light waves than said amplification waveguides, so that the width, W, of the optical field of said generated light guided by said waveguide is substantially greater than S and greater than about 75% of D.

12. The hybrid output structure of claim 11 wherein the width S of said output waveguides is less than a critical width required to achieve substantially complete confinement of guided light waves.

13. The hybrid output structure of claim 11 wherein the index of refraction differential of said output waveguides is less than a critical value required to achieve substantially total internal reflection.

14. A hybrid output structure of claim 11 wherein said output waveguides are disposed on a III-V semiconductor.

15. The hybrid output structure of claim 11 wherein said output waveguides are impurity induced layer disordered structures.

16. The hybrid output structure of claim 11 wherein said output waveguides are disposed in lithium niobate.

17. The hybrid output structure of claim 11 further comprising:
means, electrically coupled to said output waveguides, for applying a voltage bias to a voltage region part, disposed under said means, of each of said plurality of output waveguides, with the length of the voltage region part varying according to a predetermined contact function across said plurality of output waveguides to deflect said output beam by a predetermined angle.

18. The hybrid output structure of claim 17 wherein said predetermined contact function is a linear function.

19. The hybrid output structure of claim 17 wherein said means for applying a voltage bias comprises:
an electrode pair, disposed over the surface of the coupler, having a first edge oriented parallel to said boundary and having a second edge oriented at an angle of 45° to said boundary.

20. The hybrid output structure of claim 19 wherein the shape of said second edge is a selected geometric shape.

21. An integrated semiconductor structure comprising:
a monolithic semiconductor structure, divided into first and second parts separated by a boundary, having a plurality of semiconductor heterostructure layers disposed over a substrate, at least one of said layers being an active layer for light amplification and propagation under lasing conditions;
means, electrically coupled only to said first part, for applying an electrical forward bias to said layers in said first part to generate light waves in said active layer;
a plurality of index-guided amplification waveguides disposed in said first part for propagating only an in-phase array mode and terminating at said boundary;
a plurality of substantially parallel, spaced apart, low-loss, two-dimensional index-guided output waveguides disposed in said second part, each output waveguide oriented co-axially to a corresponding amplification waveguide and co-extensively coupled thereto at said boundary, with each output waveguide of width S and separated from an adjacent waveguide by a distance D, for guiding said amplified light waves generated in said corresponding coupled amplification waveguide; and
means, electrically coupled to only said second part, for applying a voltage bias to a voltage region part, disposed under said means, of each of said plurality of output waveguides, with the length of the voltage region part varying according to a predetermined contact function across said plurality of output waveguides to deflect said output beam by a predetermined angle.

22. The integrated semiconductor structure of claim 21 wherein said plurality of amplification waveguides are in the form of a y-coupled waveguide array.

23. The integrated semiconductor structure of claim 21 wherein:
said predetermined contact function is a linear function.

24. The integrated semiconductor structure of claim 21 wherein said means for applying a reverse bias comprises:
an electrode pair, disposed over the surfaces of the second part of said structure, having a first edge oriented parallel to said boundary and having a second edge oriented at an angle of 45° to said boundary.

25. The integrated semiconductor structure of claim 24 wherein the shape of said second edge is a selected geometric shape.

26. The integrated semiconductor structure of claim 21 wherein said output waveguides are structures formed in said second part utilizing a layer disordering technique.

27. The integrated semiconductor structure of claim 21 wherein said output waveguides are structures formed in said second part utilizing an impurity induced layer disordering technique.

28. The integrated semiconductor structure of claim 21 with the magnitude of the width S less than the critical width required for substantially complete confinement of said generated light so that the width, W, of the optical field of said generated light guided by said waveguide is substantially greater than S and greater than about 75% of D.

29. The integrated semiconductor structure of claim 21 wherein the index of refraction differential of said output waveguides is less than a critical value required to achieve substantially total internal reflection.

30. A semiconductor laser array comprising:
a monolithic structure, divided into first, second, and third parts separated by first and second boundaries, and having an active layer;
means, electrically coupled only to said second part, for applying an electrical bias to said layers in said second part to generate light waves in said active layer;
a plurality of index-guided amplification waveguides disposed in said second part for propagating only an in-phase array mode and terminating at said first and second boundaries;
a first plurality of substantially parallel, spaced apart, low-loss, two-dimensional index-guided output waveguides disposed in said first part, each output waveguide oriented co-axially to a corresponding amplification waveguide and co-extensively coupled thereto at said first boundary, with each output waveguide of width S and separated from an adjacent output waveguide by a distance D, said output waveguide for guiding said amplified light waves generated in said corresponding coupled amplification waveguide; and
a second plurality of substantially parallel, spaced apart, low-loss, two-dimensional index-guided output waveguides disposed in said third part, each output waveguide oriented co-axially to a corresponding amplification waveguide and co-extensively coupled thereto at said second boundary, with each output waveguide of width S and separated from an adjacent output waveguide by said distance D, said output waveguide for guiding said amplified light waves generated in said corresponding coupled amplification waveguide, with said output waveguides in said first and second pluralities providing less confinement of guided light waves than said amplification waveguides, so that the width, W, of the optical field of said generated light guided by said output waveguides is substantially greater than S and greater than about 75% of D.

31. The laser array of claim 30 wherein the width S of said output waveguides is less than a critical width required to achieve substantially complete confinement of guided light waves.

32. The laser array of claim 30 wherein the index of refraction differential of said output waveguides is less than a critical value required to achieve substantially total internal reflection.

33. The laser array of claim 30 wherein said plurality of amplification waveguides are in the form of a y-coupled waveguide array.

34. The laser of claim 30 wherein at least one of said first, second, or third parts is formed utilizing a layer disordering technique.

35. The laser of claim 30 wherein said at least one of said first, second, or third parts is formed utilizing an impurity induced layer disordering technique.

36. A semiconductor laser array comprising:
a monolithic semiconductor structure, divided into first and second parts separated by a boundary, having a plurality of semiconductor heterostructure layers disposed over a substrate, at least one of said layers being an active layer for light amplification and propagation under lasing conditions;
means, electrically coupled only to said first part, for applying an electrical forward bias to said layers in said first part to generate light waves in said active layer;
a plurality of amplification waveguides disposed in said first part for generating and amplifying light waves in response to said electrical forward bias and terminating at said boundary;
a plurality of low-loss, two-dimensional index-guided output waveguides disposed in said second part, for propagating only an in-phase array mode, oriented co-axially to a corresponding amplification waveguide and co-extensively coupled thereto, with each output waveguide of width S and separated from an adjacent output waveguide by a distance D, and for providing low confinement of a guided light wave at an output facet, so that the width, W, of the optical field of said generated light guided by said waveguide is substantially greater than S and greater than about 75% of D.

37. The laser array of claim 36 wherein said plurality of output waveguides are in the form of a y-coupled array.

38. The laser array of claim 36 wherein the width S of said output waveguides is less than a critical width required to achieve substantially complete confinement of guided light waves.

39. The laser array of claim 36 wherein the index of refraction differential of said output waveguides is less than a critical value required to achieve substantially total internal reflection.

40. The laser array of claim 36 wherein said plurality of amplification waveguides are in the form of a y-coupled waveguide array.

41. The laser of claim 36 wherein said monolithic semiconductor structure is further divided into a third part where at least one of said first, second, or third parts is formed utilizing a layer disordering technique.

42. The laser of claim 36 wherein said monolithic semiconductor structure is further divided into a third part where said at least one of said first, second, or third parts is formed utilizing an impurity induced layer disordering technique.

* * * * *